United States Patent

Hawkins

Patent Number: 5,858,615
Date of Patent: Jan. 12, 1999

[54] HARDENABLE PHOTOIMAGEABLE COMPOSITIONS

[75] Inventor: Robert E. Hawkins, Irvine, Calif.

[73] Assignee: Morton International, Inc., Chicago, Ill.

[21] Appl. No.: 903,634

[22] Filed: Jul. 31, 1997

[51] Int. Cl.⁶ ................................................ G03F 7/004
[52] U.S. Cl. ................................. 430/280.1; 522/63
[58] Field of Search ............................. 430/280.1; 522/63

[56] References Cited

U.S. PATENT DOCUMENTS

| | | | |
|---|---|---|---|
| 4,189,323 | 2/1980 | Buhr | 430/281.1 |
| 4,601,972 | 7/1986 | Small, Jr. | 430/280.1 |
| 4,795,693 | 1/1989 | Ors et al. | 430/312 |
| 4,902,610 | 2/1990 | Shipley | 430/312 |
| 5,246,817 | 9/1993 | Shipley, Jr. | 430/312 |
| 5,262,280 | 11/1993 | Knudsen et al. | 430/312 |
| 5,312,715 | 5/1994 | Daniels et al. | 430/280.1 |
| 5,432,039 | 7/1995 | Shinokawa et al. | 430/191 |

FOREIGN PATENT DOCUMENTS

| | | |
|---|---|---|
| 6-118647 | 4/1994 | Japan . |

OTHER PUBLICATIONS

AN 94–179077, English Abstract of Japanese Patent Document 06–118647, Derwent Informatin LTD, online WPIDS Files. (No Date).

121: 145408CA, English Abstract of Japanese Patent Document 06–118647, Chemical Abstracts, American Chemical Society (No Date).

06–118647, English Abstract of Japanese patent Document 06–118647, Patent Abstracts of Japan, vol. 18, No. 402, Published Jul. 27, 1994.

*Primary Examiner*—Cynthia Hamilton
*Attorney, Agent, or Firm*—Wayne E. Nacker; Gerald K. White

[57] ABSTRACT

A negative-acting photoimageable composition comprises

A) between about 30 and about 90 wt % of a binder polymer which is soluble in an appropriate developer, B) between about 5 and about 30 wt % of an epoxy resin, C) between about 0 and about 30 wt % of a polyol cross-linking agent for the epoxy resin B), and D) between about 5 and about 15 wt % of a photosensitive composition of the formula:

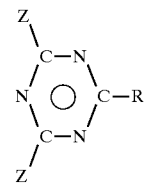

where the Zs are the samne or different and are selected from $CX_3$, X, and H; the X's are the same or different halogens, and R is any chemical moiety consistant with the photoimageable composition as a whole.

8 Claims, No Drawings

HARDENABLE PHOTOIMAGEABLE COMPOSITIONS

The present invention is directed to a negative-acting photoimageable dielectric composition which may be used, for example, to form the permanent innerlayers of a multilayer printed circuit board, and to a method for forming such a board. It is also directed to a novel method for manufacturing multilayer printed circuit boards by the selective plating of the dielectric layers, eliminating the need for the standard copper foil inner layers, and the photodefinition of vias, thereby eliminating the need for drilled holes in most instances. The invention is also directed to the use of the photoimageable dielectric composition as a solder mask.

BACKGROUND OF THE INVENTION

Multilayer printed circuit boards have traditionally comprised a stack of individual printed circuit boards or innerlayers separated by dielectrical material. The circuitry of the several innerlayers is electrically connected by bored and plated through-holes. Multilayer printed circuit boards provide circuitry in a three-dimensional array and are therefor advantageously space-saving, relative to individual printed circuit boards, which provide at most two layers of circuitry on a two-sided board.

These printed circuit boards are commonly provided with internal ground and power planes. These internal planes are frequently solid sheets of copper interrupted only by clearance holes (the perforations required for electrically isolating the through-hole pattern of the printed circuit board). Ground and power planes provide power voltage and current and ground connections for the components of the multilayer printed circuit. A second function of the ground and power planes is to provide electromagnetic shielding for the multilayer printed circuit board and reduce the electromagnetic and radio frequency interference. Multiple ground and power planes and additional ground planes on the surface layers with the conductive pattern are common.

Multilayer circuits enable formation of multiple circuits in minimal volume. They typically comprise a stack of layers with layers of signal lines (conductors) separated from each other by dielectric layers having plated through-holes known as vias providing electrical interconnections between the layers.

Current processes for fabricating multilayer boards are extensions of methods used for fabricating double-sided boards. The method comprises fabricating of separate innerlayers having circuit patterns disposed over their surface. A photosensitive material is coated over the copper surfaces of a copper clad innerlayer material, imaged, developed, and etched to form a conductor pattern in the copper cladding protected by the photosensitive coating. After etching, the photosensitive coating is stripped from the copper, leaving the circuit pattern on the surface of the base material. Following formation of the innerlayers, a multilayer stack is formed by preparing a lay up of innerlayers, ground plane layers, power plane layers, etc., typically separated from each other by a dielectric prepeg (a layer consisting of glass cloth impregnated with partially cured material, typically a B-stage epoxy resin). The outer layers of the stack comprise copper-clad, glass-filled epoxy board material with the copper cladding comprising exterior surfaces of the stack. The stack is laminated to form a monolithic structure using heat and pressure to fully cure the B-stage resin.

Interconnections or through-holes, buried vias, and blind hole interconnections are used to connect circuit layers within a multilayer board. The buried vias are plated through-holes connecting two sides of an innerlayer. Blind vias typically pass through one surface of the stack and pass into and stop within the stack. Regardless of the form of interconnections, holes are generally drilled at appropriate locations through the stack, catalyzed by contact with a plating catalyst and metallized, typically with electroless copper that is overplated with electrolytic copper, to provide electrical contact between circuit innerlayers.

The uses, advantages and fabricating techniques for the manufacture of multilayer boards are described by Coombs, Printed Circuits Handbook, McGraw Hill Book Company, New York, 2nd edition, pp. 20–3 to 23–19, 1979, incorporated herein by reference.

Multilayer boards have become increasingly complex. For example, boards for main frame computers may have as many as 36 layers of circuitry, with the complete stack having a thickness of about ¼ inch. These boards are typically designed with 4 mil wide signal lines and 12 mil diameter vias for interconnections between signal line layers. For increased densification, it is desired to reduce signal lines to a width of 2 mils or less and vias to a diameter of 2 to 5 mils or less.

The photoimageable dielectric coatings for printed circuit boards on the leading edge of the technology must be capable of being processed in a minimum number of steps. Their dielectric and photolithographic properties, flexibility, and intercoat adhesion also must be excellent. A low photospeed, high moisture resistance, and good adhesion to a plated metal are also important properties of such coatings.

This invention is directed to negative-acting photosensitive dielectric compositions. The processing of negative-acting photoresists generally follows the sequence of applying a solution of the resist to a copper foil laminated to an epoxy resin base, drying and baking the resist to expel the solvent, exposing the resist to actinic radiation through a patterned photomask to define an image, dissolving the non-exposed portions of the resist in a developer, such as an alkaline aqueous developer to delineate the irnage, rinsing, and in some instances post-baking the imaged resist. The areas void of resist are then either etched, plated with metal, or filled with a conducting polymer. As discussed above, the use of copper foil is eliminated by the method of this invention.

This invention's currently preferred embodiments are closely akin to the invention described in U.S. Ser. No. 08/801,682 filed 18 Feb. 1997. The invention described therein is directed to a positive-acting photoimageable composition which has a similar function to the photoimageable composition of the present invention. The positive-imaging composition in that application contains a hydroxy-functional novalac resin, a cross-linkable resin, such as an epoxy resin, a naphthoquinone diazide, and at least one thermally labile halogen-containing cure catalyst. The novalac resin is normally soluble in alkaline aqueous solution, such as a sodium hydroxide solution. However, the naphthoquinone diazide acts to inhibit the novalac resin from being dissolved until the naphthoquinone diazide is exposed to actinic radiation; whereupon, the naphthoquinone diazide undergoes a rearrangement such that it facilitates the dissolving of the novalac resin in alkaline aqueous solution. The cross-linkable resin, particularly as catalyzed by the cure catalyst, undergoes a post development cure that renders the layer hard and permanent.

While the above-identified application details advantage of positive-acting photoresists, there are also advantages to negative-acting resists. Negative-acting resists tend to have faster photospeeds. Also, in formulations of the type discussed in the above-identified application and in the instant application, there tends to be out-gassing in positive-acting resists, whereas negative-acting resists of the type described herein do not exhibit outgassing.

It is an object of this invention to provide a novel method for manufacturing multilayer printed circuit boards by the selective plating of the dielectric layers, eliminating the need for the standard copper foil inner layers.

It is another related object of this invention to provide a negative-acting, photoimageable dielectric composition whose post-develop image is highly stable, both chemically and thermally.

It is still another object of this invention to provide a multilayer printed circuit board having permanent innerlayers made of a negative-acting photoimaged dielectric composition.

It is yet another object of this invention to provide a method for making a multilayered printed circuit board by which the vias are photodefined.

These and other objects of the invention which will become apparent from the following description of the invention.

SUMMARY OF THE INVENTION

In accordance with the invention, there is provided a negative-acting photoimageable composition comprising A) between about 30 and about 79 wt % of a binder polymer which is soluble in an appropriate developer, B) between about 5 and about 30 wt % of an epoxy resin, C) between 0 and about 30 wt %, preferably at least about 5 wt %, of a cross-linking agent for the epoxy resin B), and D) between about 1 and about 15 wt %, preferably at least 5 wt %, of a photosensitive composition of the formula:

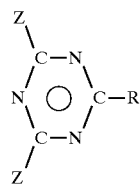

where the Zs are the same or different and are selected from $CX_3$, X, and H; the X's are the same or different halogens, and R is any chemical moiety consistant with the photoimageable composition as a whole;

the weight percentages being based on total weight of A) plus B) plus C) plus D). Preferably both Zs are $CX_3$. Preferably all Xs are Cl.

Preferably, the binder polymer is developable in alkaline aqueous solution, and most preferably the resin is a novalac resin having sufficient hydroxyl functionality to be developed in alkaline aqueous solution.

DETAILED DESCRIPTION OF THE INVENTION

To better understand the invention, the following definitions have been adopted:

Photoimageable dielectric coating means an organic dielectric coating composition capable of imaging by exposure to activating radiation and development to yield a relief image and become an integral part of a multilayer board. It may be applied as a liquid coating composition and dried to a tack-free coating or as a dry film. Preferably, the dielectric constant of the coating does not exceed 4.5.

Imaged opening means a relief image of (1) recesses or channels defining a pattern of conductors or (2) openings for interconnections, within a dielectric coating. Imaged openings are subsequently selectively metallized, whereby metal is contained within the recesses of the relief image.

Substantially means largely but not wholly that which is being specified so that the difference is inconsequential.

Unless otherwise noted, the total of compositions A) plus B) plus C) plus D) are considered to comprise 100 parts by weight. Weight percentages of each at A), B), C), and D) are also expressed relative to this total, and other minor components are expressed as weight percentages relative to this total.

In accordance with the preferred aspect of the invention, all, or the major portion, of the binder A) for the photoimageable dielectric composition of this invention is a novalac resin. The novalac resin imparts alkaline aqueous solubility to the composition due to the hydroxyl functionality of the resin. The hydroxyl functionality of the novalac resin may also react with the epoxy resin(s) B) during the photochemical reaction which occurs during exposure to actinic radiation and during any thermal crosslinking composition which might be effected subsequent to exposure and development.

Novalac resins are commonly known products of the acid catalyzed condensation of a phenol and an aldehyde such as formaldehyde, acetaldehyde, and furfural. The term phenol is used herein to mean phenols as a class and includes alkylphenols such as cresol, the xylenols, and butylated phenolic novalacs. Suitably, the amount of the novalac resin binder may be from about 30 to about 90% by weight of the total composition, but it is preferred to use from about 40 to 70%, of the novalac in the photoimageable dielectric coating composition of this invention. The resins are widely available from many chemical suppliers.

Herein, the epoxy resin B) and the cross-linking agent C), undergo, in the presence of the cure catalyst D), a photo-initiated cross-linking reaction which renders exposed portions of the photoimageable composition insoluble to alkaline aqueous solution. If not fully reacted during exposure, further cross-linking is effected by heat, such that the composition may undergo a post-development hardening. If the binder is the preferred binder, i.e., a novalac resin, or any other hydroxy-functional binder polymer, the hydroxyl functionality of the binder A) may also take part in both the photo-initiated cross-linking reaction and in any subsequent thermal cure.

The amount of epoxy resin used in the composition of the invention may be from about 5 to about 30%, but it is preferably from about 10 to about % by weight. Epoxy resins in general are suitable for purposes of this invention. Preferably, the resin has an epoxy equivalent weight of between about 70 and about 4000, more preferably between about 100 and about 500.

A particularly suitable epoxy resin for use in the present invention is trimethyol propane triglycidyl ether such as that sold as Heloxy® 48. Epoxy novalacs are another example of suitable epoxy resins. Still another suitable epoxy resin is epoxidized polybutadiene sold by Elf Atochem under the trademark POLY BD 605 and having a viscosity of 2500 cps @ 25° C. and an epoxy equivalent weight of 260.

The preferred cross-linker C) for the epoxy resin B) is a compound having multi-hydroxyl functionality, i.e., a polyol. Substantially any polyol may be used including multi-functional monomers, hydroxyl-functional polyesters, hydroxyl functional polyethers, etc. Preferred polyols for cross-linking the epoxy resin B) have —OH equivalent weights of between about 70 and about 4000, more preferably between about 100 and about 1000.

In a preferred photoimageable dielectric coating composition of this invention, a butylated phenolic novalac is used as the cross-linking polyol. The butylated phenolic novalac imparts flexibility to the cured photoimageable dielectric coating of this invention. An example of a butylated novalac cross-linker is sold as Santolinko® EP-560.

OH-functional binders and OH-functional cross-linking agents are generally stable in the presence of epoxy resins; however, upon activation, by actinic radiation, of the photosensitive compound, the —OH groups of the cross-linker C) (and any —OH groups on the binder A)) react with the epoxy resin B), producing a cross-linked structure that is insoluble in alkaline aqueous solution, such as NaOH solutions. Photosensitive compositions D) of the type used herein, have been used previously as catalysts for effecting thermal-cure of epoxies. In fact, above-noted U.S. application Ser. No. 08/801,682 uses catalysts within the scope of photosensitive compositions to effect post-development hardening of the positive-acting photoimageable compositions described therein. Herein, it is found, that these thermal catalysts are also photosensitive, and when used in sufficient amounts, i.e., about 5 wt % and upward, will promote photo-initiated cross-linking of epoxy resins. It is believed that these compounds, when exposed to actinic radiation, give off halogen ions which promote the cross-linking of —OH and epoxy groups. The R group in the generalized formula above may be any group, even H, which is otherwise compatible with the composition as a whole, but preferably is an unsaturated group, such as an aromatic or substituted aromatic group or a styryl group. Different R groups may be used to according to the absorbance maximum, whereby the absorbance maximum may be tailored to the source of actinic radiation. Some specific examples of photosensitive compounds useful in the present invention include, but are not limited to: 2,4-trichloromethyl (4-methoxyphenyl) 6-triazine, CAS no. 3584-23-4; 2,4-trichloromethyl (4-methoxynaphthyl) 6-triazine, CAS no. 69432-40-2; 2,4-trichloromethyl (piperonyl) 6-triazine, CAS no. 71255-78-2; and 2,4-trichloromethyl (4-methoxystyryl) 6-triazine, CAS no. 42573-57-9. Mixtures of these compounds may also be used. Of course, these compounds also act in their usual function as thermal cure catalysts. Generally, only a portion of the photosensitive compound is depleted during the photoinitiated reaction, and residual photosensitive compound is generally available to promote a post-development thermal hardening. Of course, other thermal cure catalysts may be used in conjunction with the photosensitive compound D), but these are not necessary, and, therefore, not preferred.

Cross-linkers C) as alternatives to polyols include glycoluril, benzoquanamine, melamine and urea.

Fillers may be used in amounts of from about 2 to about 10% by weight in order to control the flow of resins therein while the composition is being cured at elevated temperatures. Fumed silica such as that sold as CAB-O-SIL® and SYLOIDO® is an example of a useful filler. The CAB-O-SILO® M-5 silica is particularly useful.

A leveling agent such as those sold as MODAFLOW® in the amount of from about 0.2 to about 3% by weight is also useful. A flexibilizing agent such as a poly(vinylmethyl ether) sold under as LUTANOL® M is particularly useful in the preparation of a dry film of this invention. An effective amount of the flexibilizing agent is from about 10 to about 20 percent by weight.

The dielectric constant of the photoimageable dielectric coating composition of this invention preferably is not greater than 4.5 and more preferably is not greater than 3.5. The resolution is preferably sufficient to provide line widths of 10 mils or less, more preferably 5 mils or less, and still more preferably about 2 mils or less.

The photoimageable dielectric coating composition of this invention may be applied to a substrate as a liquid, then dried, imaged by exposure to UV light and development, and cured. Or it may be cast as a dry film for storage and subsequent lamination onto a substrate for imaging and curing. The liquid coating composition may be coated onto the surface of a substrate in a variety of ways, including screening, roller coating, curtain coating, and spray coating. A water-miscible solvent such as propylene glycol methyl ether acetate may be used in amounts necessary to adjust the viscosity of the photoimageable dielectric coating compositions of this invention to suit the coating method and coating thickness desired. The dielectric substrate for the printed circuit board use may be, for example, a glass-epoxy construction or a polyimide. The coating is tack-dried at about 90° C. for about 30 minutes and then irradiated through a mask in an image pattern by ultraviolet light having a wave length in the range of from 350 to 450 nm. The total dosage of UV light is from 100 to 800 mj/cm$_2$. The exposed coating is then developed in a 0.17 to 0.3 normal aqueous solution of sodium hydroxide at from 80° to 100° F. (27°–38° C.), rinsed, and cured at a temperature of from 140° to 175° C. for about one hour.

Dry film may be made by drawing down the liquid coating composition with a Baker bar at a setting of from about 4 to about 20 and drying it in a convection oven or tunnel dryer for about 2 to about 60 minutes at from about 35° to about 105° C. to obtain films ranging from about 0.5 mil to about 3 mils thick. The dry film may then be laminated onto a dielectric substrate, such as a polyimide fllm or an epoxy resin impregnated glass fiber board either at room temperature or at an elevated temperature, e.g., 180° F. (82° C.). A Hot Roll (DYNACHEM® Model 300 or 360) laminator may be used at a speed of 1 to 5 feet per minute, a roll pressure of 40 to 60 psi (0.28–0.41 MPa), and a roll temperature of 225° to 300° F. (113°–150° 1 C.). Vacuum laminators, such as models 724 and 730 sold by Morton International, Inc. may be used, also. In conventional vacuum lamination, in addition to heat and vacuum, mechanical pressure is brought to bear against the dry film. In what is known as a "slap down" process, a rubber blanket is used to press the dry film against the substrate. During vacuum lamination, the photoimageable dielectric dry film is heated to a board surface temperature of 55°–90° C. with a cycle time of 30–90 seconds and a slap down cycle of 4–12 seconds. A post lamination bake may last for about 30 minutes at about 90° C. (194° F.) but it may be eliminated under certain conditions. The laminate is then irradiated through a mask in an image pattern by ultraviolet light and developed as described above.

High resolution relief images including openings that are approximately equal to the thickness of the coating may thus be achieved. By use of such coatings, imaged openings for interconnections and conductors can be of a size equivalent to the resolution capability of the dielectric coating and the method of imaging and may be in any desired shape.

Selective metal deposition in the imaged openings may be performed in a conventional manner in the process of this invention. It is characterized by the selective metallization of the relief image of the dielectric coating without an increase in the surface resistivity of an underlying substrate between conductor lines. Plating can occur only on those areas where the resist has been removed (additive production of the circuits), or on the entire surface including areas where the resist was removed by development as well as upon the resist itself (subtractive production of the circuits) or some degree of plating falling between these extremes (semi-additive production of the circuits). For a discussion of the specifics of circuitry and interconnect creation see U.S. Pat. No. 4,847,114 (Brach et al), the teachings of which are incorporated by reference.

If the additive process is chosen, then plating will occur in those areas where the photoimageable dielectric coating has been removed by development and upon the surface of the dielectric in a defined manner such that defined circuitry and interconnects are created. Thus, the plating itself will define the circuitry and other features desired. In the additive process, the photoimaging of the permanent dielectric will create and define the circuitry and other surface features desired as well as the holes and vias which will interconnect the various layers of the circuitry package.

If the substrate to be coated is a circuit, the process may comprise formation of a dielectric coating over a circuit with imaged openings defining interconnections. The walls of the imaged openings in the dielectric coatings contain metal as it deposits during plating and assures a desired cross sectional shape of the deposit. The process is repeated sequentially to form sequential layers of circuits and interconnections.

In the subtractive procedure, the entire surface will be plated. The circuitry and other features will be defined by subsequent etching of the plated metal. In the subtractive manner, the photodefinition of the permanent resist will typically be used for the creation of holes and vias which connect the various layers of the circuitry package, thus eliminating the need for drilling holes.

The plating solution is typically an electroless copper plating solution well known in the art and typically comprises a source of cupric ions, a complexing agent to hold the ions in solution, a reducing agent to reduce the cupric ions to metallic copper in the presence of the catalyst-e.g., formaldehyde and a pH adjustor. Typical copper plating solutions are disclosed in U.S. Pat. Nos. 4,834,796; 4,814,009; 4,684,440; and 4,548,644, the teachings of each of which are incorporated herein by reference.

The invention is described above primarily in terms of a composition having a hydroxyl-functional binder polymer, such as a novalac resin. However, other binder systems could be used, including a binder which is not soluble in alkaline aqueous solution but which is soluble in suitable organic developing solvents. A carboxylic acid functional binder polymer may be used, in which case, the composition may be developed in weaker bases, such as sodium bicarbonate solutions. However, whereas OH-functional binders have long-term stability in the presence of the epoxy resins, carboxylic acids react more readily with epoxy groups and therefore would have to be provided as a two-part composition with the parts admixed at the point of application.

The coating composition and process of this invention are further described in the following examples, which are not limiting in any way. All parts are by weight unless otherwise indicated and all components are 100% solids unless otherwise indicated.

EXAMPLE 1

| Schenectady HRJ-10805 | Novalac resin | 57.5% |
|---|---|---|
| Epon 164 | cresylic novalac-epoxy | 7.5% |
| Heloxy 48 | trimethyol propane triglycidyl ether | 15.0% |
| Santolink EP-560 | butylated novalac crosslinker | 10.0% |
| 2,4-Trichloromethyl (peperonyl) 6-triazine | CAS #711255-78-2 | 10.0% |

As minor components, the formulation also includes 1.5 wt % Modaflow ® (a flow control agent), 0.25 wt % Basic Blue 81, and 0.45 wt % functionalized sila triethoxy-(3-(4,5-dihydroimidazol-1-yl)-propyl)-silane, weight percentages of these minor components being expressed relative 100 wt % of the major components.

The formulation when cast as a 25 micron coating, produced a glossy image with a breakpoint of 62 seconds in 0.25N sodium hydroxide at 95° F. (35° C.). Minimum exposure requirements were not assessed; however 300 mJ sufficed. The image was thermally cured for 1 hour at 311° F. (155° C.) and yielded a pencil hardness of 2H.

What is claimed is:

1. A negative-acting photoimageable composition consisting essentially of
   A) between about 30 and about 90 wt % of a binder polymer which is soluble in a developer selected from the group consisting of a alkaline aqueous solution and organic solvents,
   B) between about 5 and about 30 wt % of an epoxy resin,
   C) between about 5 and about 30 wt % of a cross-linking agent for the epoxy resin B), and
   D) between about 1 and about 15 wt % of a photosensitive composition of the formula:

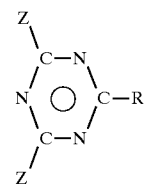

where the Zs are the same or different and are selected from $CX_3$, X, and H; the X's are the same or different halogens, and R is any chemical moiety compatible with the photoimageable conposition as a whole.

2. The composition according to claim 1 wherein both Zs are $CX_3$.

3. The composition according to claim 1 wherein all Xs are Cl.

4. The composition according to claim 1 wherein D) is selected from the group consisting of:
2,4-trichloromethyl (4-methoxyphenyl) 6-triazine, CAS no. 3584-23-4;
2,4-trichloromethyl (4-methoxynaphthyl) 6-triazine, CAS no. 69432-40-2;
2,4-trichloromethyl (piperonyl) 6-triazine, CAS no. 71255-78-2;
2,4-trichloromethyl (4-methoxystyryl) 6triazine, CAS no. 42573-57-9 and mixtures thereof.

5. The composition according to claim 1 wherein said binder A) is soluble in alkaline aqueous solution.

6. The composition according to claim 1 wherein said binder has sufficient —OH functionality to render it soluble in alkaline aqueous solution.

7. The composition according to claim 1 wherein said binder is a novolac resin having sufficient —OH functionality to render it soluble in alkaline aqueus solution.

8. The composition according to claim 1 wherein said cross-linker is a polyol.

* * * * *